(12) United States Patent
Gerst et al.

(10) Patent No.: US 8,638,181 B2
(45) Date of Patent: Jan. 28, 2014

(54) WIDEBAND BALUN USING RE-ENTRANT COUPLED LINES AND FERRITE MATERIAL

(75) Inventors: Carl Gerst, Skaneateles, NY (US); Jeffrey C. Merrill, Manlius, NY (US)

(73) Assignee: Anaren, Inc., East Syracuse, NY (US)

( * ) Notice: Subject to any disclaimer, the term of this patent is extended or adjusted under 35 U.S.C. 154(b) by 343 days.

(21) Appl. No.: 13/212,643

(22) Filed: Aug. 18, 2011

(65) Prior Publication Data

US 2012/0049971 A1    Mar. 1, 2012

Related U.S. Application Data

(60) Provisional application No. 61/375,319, filed on Aug. 20, 2010.

(51) Int. Cl.
*H03H 7/42* (2006.01)
*H01P 3/08* (2006.01)

(52) U.S. Cl.
USPC ............................................ 333/25; 333/238

(58) Field of Classification Search
USPC .................... 333/4, 25, 26, 236, 238
See application file for complete search history.

(56) References Cited

U.S. PATENT DOCUMENTS

| | | | |
|---|---|---|---|
| 3,237,130 A | | 2/1966 | Cohn |
| 5,563,558 A | * | 10/1996 | Mohwinkel et al. .......... 333/127 |
| 5,808,518 A | | 9/1998 | McKinzie, III et al. |
| 5,903,198 A | * | 5/1999 | Weiss ........................... 333/24.1 |
| 7,656,262 B2 | * | 2/2010 | Muto ............................. 336/200 |
| 7,683,734 B2 | * | 3/2010 | Catoiu .......................... 333/115 |
| 7,791,444 B2 | * | 9/2010 | Tomonari et al. ............. 336/192 |
| 2003/0003776 A1 | | 1/2003 | Lohr et al. |
| 2008/0246679 A1 | | 10/2008 | Martek et al. |
| 2009/0045886 A1 | | 2/2009 | Gruchalla |
| 2011/0181376 A1 | * | 7/2011 | Vanhille et al. ............... 333/243 |

OTHER PUBLICATIONS

Cohn, Syemour B., The Re-Entrant Cross Section and Wide-Band 3-dB Hybrid Couplers, IEEE Transactions on Microwave Theory and Techniques, Jul. 1963, pp. 254-258.

* cited by examiner

*Primary Examiner* — Dean O Takaoka
(74) *Attorney, Agent, or Firm* — George R. McGuire; Bond Schoeneck & King PLLC

(57) ABSTRACT

A Guanella type balun with a conductive enclosure (for example, a re-entrant box) between its coupled lines and the magnetic material enclosing its coupled lines. Some embodiments use coupled strip lines. Some embodiments have dielectric material, such as printed circuit board material inside the re-entrant box along with the coupled strip lines. Preferably, the magnetic material is ferrimagnetic. Some preferred magnetic materials are non-conductive.

14 Claims, 16 Drawing Sheets

WIDEBAND BALUN USING RE-ENTRANT COUPLED LINES AND FERRITE MATERIAL

RELATED APPLICATION

The present application claims priority to U.S. provisional patent application No. 61/375,319, filed on Aug. 20, 2010; all of the foregoing patent-related document(s) are hereby incorporated by reference herein in their respective entirety(ies).

BACKGROUND OF THE INVENTION

1. Field of the Invention

The present invention relates to baluns and more particularly to Guanella style baluns.

2. Description of the Related Art

It has long been known that an enclosure of conductive material will block electrical fields. That is, electrical fields inside the enclosure do not leak out and electric fields outside the enclosure do not get inside of the enclosure. The enclosure does not need to be continuous (for example, it may be a mesh) but it must be at least somewhat continuous to substantially block passage of electrical fields in or out of the enclosure. For example, U.S. Pat. No. 3,237,130 ("130 Cohn") discloses a directional coupler for microwave wavelength signals that includes conductive enclosures, specifically an intermediate conductor (see 130 Cohn at its FIG. 4A, reference numeral 58) and an outer conductor (see 130 Cohn at its FIG. 4A, reference numeral 52). The use of a conductive enclosure around transmission lines, as in the couplers of 130 Cohn, is sometimes referred to as a re-entrant enclosure, and the coupler of 130 Cohn is called a re-entrant coupler.

A balun is a known type of electrical component. A balun is a two port electronic device that transforms a signal between a signal suitable for a balanced transmission line and a signal suitable for an unbalanced transmission line. The two ports of the balun are referred to as the unbalanced port (referenced to ground) and the balanced port (two terminals, one referenced to the other). Applications for balun transformers include antenna feed circuitry, push-pull amplifiers, circuitry for splitting and combining signals and other circuitry where transformation from balanced to unbalanced signals is required.

One type of known balun is the "Guanella balun," a well known circuit configuration. Guanella baluns are characterized by their impedance ratios. More specifically, an x:y Guanella balun has an unbalanced port impedance that is x/y times its balanced port impedance. Some popular types of Guanella baluns are 1:1 Guanella baluns, 1:4 Guanella baluns and 4:1 Guanella baluns. 1:1 Guanella balun circuits may include only a single set of coupled, but often Guanella baluns will have multiple sets of coupled lines.

Guanella baluns use magnetic material (usually ferrite) to increase the impedance seen by common mode currents. This increase in common mode impedance is paramount to the performance of the balun. The higher the common mode impedance, the better the balun performance. The performance of a Guanella balun can be understood by considering the transmission line model 100 as seen in FIG. 1A. The reactance of the windings will affect the common mode impedance and therefore set the low frequency performance. Ferrite material can be used to increase this reactance. Notice in model 100, if node 5 is connected to ground, the device can be considered a three port device with the balance port load (RL) now split into two separate loads each of which is referenced to ground (see, path from node 4 to node 5 and path from node 2 to node 5). The ports will all be matched when the two separate loads are each $R_L/2$. The same is true of a load connected between the two terminals of the balanced port in the coupled transmission line model 150, shown in FIG. 1B. It is desirable to have the same amplitude at each of the two loads when a signal is applied to the unbalanced port. The difference between the amplitudes at the two loads is called amplitude balance. The signals should also be 180 degrees out of phase and any error from this phase difference is called phase balance.

More recently, the analysis has been extended to use coupled transmission lines (i.e., couplers) as shown in FIG. 1B. As shown in FIG. 1B, the coupled transmission lines are surrounded by magnetic material 151 which characterizes a Guanella type balun. When a coupled line structure is used to implement the Guanella 1:1 balun circuit, the coupler parameters will define the port impedances and the frequency of operation. The coupler parameters are adjusted by changing material properties and the circuit configuration. If the balun is implemented using coupled lines, increasing the coupler even mode impedance (Zeven) will increase the impedance seen by common mode currents. The higher Zeven, the better the balun will perform. The frequency band of operation will be centered at the frequency where the coupler electrical length is 90 degrees (or one quarter wavelength). The bandwidth will increase with increases in Zeven. The balun will not work when the coupled line section is 0 degrees (DC) or at odd multiples of 180 degrees.

FIG. 2A shows coupled line structure schematic 175 including: dielectric material 179; ground planes 177; and plane of symmetry 181. FIG. 2B shows odd mode field pattern schematic 200 including perfect electric wall 202. FIG. 2C shows even mode electric field pattern schematic 225 including 225 including perfect magnetic wall 227. Guanella baluns have been constructed using stripline broadside couplers. This type of coupled line structure is often analyzed using the well established even/odd mode analysis illustrated in FIGS. 2A, 2B and 2C. With broadside coupled lines, the odd mode fields are mostly, but not all, contained between the coupled lines. For example, as shown in odd mode schematic 200, numerous field lines 204a run between the coupled lines, while relatively few field lines 204b do not run between the coupled lines. As shown in schematic 225, the even mode fields are primarily concentrated between the traces and the ground planes. It is desirable for balun performance to increase the impedance seen by the even mode fields while keeping the odd mode impedance constant at Zodd. A few equations relating the coupler impedances to the 1:1 balun port impedances are:

$$\text{Zunbal} = \text{Zbal} \qquad \text{Eq. (1):}$$

$$\text{Zodd} = \text{Zbal}/2 \qquad \text{Eq. (2):}$$

$$\text{Zeven} > 20 \times \text{Zodd; for reasonable operation—the higher the better.} \qquad \text{Eq. (3):}$$

In Equations (1) to (3): (i) Zunbal=Unbalanced (single ended) port impedance of the balun; (ii) Zbal=Balanced port impedance of the balun; (iii) Zeven=even mode impedance of the coupler used to construct the balun; and (iv) Zodd=odd mode impedance of the coupler used to construct the balun.

The odd mode impedance can be adjusted by changing the line width, spacing between the lines and material properties. The even mode impedance can be set as high as possible by making the coupled lines narrow and increasing the distance between the coupled lines and the ground planes. Any of these adjustments should preferably be made while simultaneously maintaining the desired odd mode impedance and increasing the even mode impedance. From Eq. (1), Zeven should be 20 times greater than Zodd. When this is the case, the ideal response for a [5.7:1] frequency bandwidth would be characterized as follows: (i) amplitude balance ≈1.0 dB (0.9 dB at Fc); (ii) phase balance ≈±10 degrees (170 degrees at $F_{low}$, 180 degrees at Fc, 190 degrees at $F_{high}$); and (iii) return loss ≈26 dB.

This would not be acceptable for many applications and the Zeven required for these conditions is very difficult to achieve (while maintaining the required Zodd) using conventional, dielectric only coupled line structures. Spiral couplers have been investigated for the purpose of increasing even mode impedance but in general require very narrow coupled transmission lines, which severely limits the power handling capability of the balun.

FIG. 3A shows coupled line structure schematic 250 including: ground planes 252; dielectric material 254; ferrite material 256; and plane of symmetry 258. FIG. 3B shows odd mode field pattern schematic 275 including perfect electrical wall 277. FIG. 3C shows even mode field pattern schematic including perfect magnetic wall 302. FIGS. 3A, 3B and 3C illustrate the addition of magnetic material (usually ferrite) in the construction of a balun using broadside coupled lines. The coupled lines are still printed on dielectric material, but the dielectric material is enclosed in the ferrite material. The field patterns change based on the magnetic material properties. The magnetic materials are characterized by their permeability ($\mu$) and permittivity ($\in$). Both of these parameters are complex values with real parts $\mu'$ and $\in'$ and imaginary parts $\mu''$ and $\in''$. The imaginary parts represent the loss associated with the material. In general, Zeven will be increased due to the relatively large permeability ($\mu$) of the magnetic material. Most dielectric materials have $\mu=1$ but some known ferrite materials have $\mu>1$. When $\eta>1$ the inductance of the transmission line will increase and the impedance will also increase. This is due to the impedance Equation (4) and a related Equation (5). Eq. (4): Z=squareroot (L/C). Eq. (5): Z $\alpha$ squareroot ($\mu/\in$)

The $\mu$ and $\in$ will also affect the electrical length of the coupled lines. Increasing $\mu$ or $\in$ will increase the propagation constant as shown by Equations (6) and (7). Eq. (6): $\beta=\omega$ (squareroot (LC)). Eq. (7): $\omega$ $\alpha$ squareroot ($\mu\in$).

One design for a Guanella balun is disclosed in U.S. Pat. No. 5,808,518 ("518 McKinzie"). 518 McKinzie a Guanella type balun (with its characteristic magnetic material) that uses strip transmission lines, as opposed to the other types of coupled lines. 518 McKinzie is directed to a 1:4 Guanella balun and therefore has two pairs of couple transmission lines. Each pair of strip transmission lines is located in its own respective magnetic material enclosure, specifically an enclosure in the form of a tube.

The following published documents may also include helpful background information: (i) US patent application 2008/0246679 ("679 Martek"); (ii) US patent application 2003/0003776 ("776 Lohr"); (iii) US patent application 2009/0045886 ("Gruchalla"); and (iv) "The Re-entrant Cross Section and Wide-Band 3-dB Hybrid Couplers," by Seymour B. Cohn, *IEEE Transactions on Microwave Theory and Techniques*, July 1963.

Description Of the Related Art Section Disclaimer: To the extent that specific publications are discussed above in this Description of the Related Art Section, these discussions should not be taken as an admission that the discussed publications (for example, published patents) are prior art for patent law purposes. For example, some or all of the discussed publications may not be sufficiently early in time, may not reflect subject matter developed early enough in time and/or may not be sufficiently enabling so as to amount to prior art for patent law purposes. To the extent that specific publications are discussed above in this Description of the Related Art Section, they are all hereby incorporated by reference into this document in their respective entirety(ies).

BRIEF SUMMARY OF THE INVENTION

The present invention generally relates to an electronic component referred to as a "balun," and specifically addresses a new construction for a balun, as well as new construction methods for constructing baluns. Preferred baluns according to the present invention are designed to operate in the high frequency (RF) spectrum (HF, VHF, UHF, Microwave). Preferred baluns according to the present invention have: (i) good performance over a wide frequency range (a broadband device); (ii) can handle high signal levels (hundreds of Watts); and/or (iii) can be packaged in a volume that is significantly smaller than what is otherwise available today.

The present invention is directed to a balun that includes a balanced port, an unbalanced port, a first pair of coupled lines, a magnetic material member that encloses the first pair of coupled lines and an electrically conductive member arranged to field-enclose (see DEFINITIONS section) the first pair of coupled lines. Preferably, the first pair of coupled lines is in the form of strip lines. Preferably, the electrically conductive member is located on an interior surface of the magnetic member and is thin relative to the thickness of the magnetic member and/or to the cross-sectional transverse width or diameter of the first pair of coupled lines. For example, the thickness of the electrically conductive member may be one skin depth or less. Preferably, the magnetic material is ferrimagnetic. Preferably, the magnetic material is selected so that: (i) it is ferrimagnetic; and (ii) electrically non-conductive. Not every ferrimagnetic, non-electrically conductive material will necessarily work. However, those of skill in the art of Guanella baluns will be able to determine exactly which magnetic materials will work and which will not. One material that will work, and is preferred, is 52 ferrite material sold by Fair-Rite Products Corp. of Wallkill, N.Y. (The terms "Fair-Rite" and/or "52 ferrite material" maybe subject to trademark rights in various jurisdictions throughout the world and are used here only to refer to the products and/or services of the trademark owner.) Preferred embodiments of the present invention have operating frequencies in the following range 30 MHz to 1000 MHz.

Preferably, the balun further includes a first dielectric member located at least in the space between the first pair of coupled lines. Preferably, the first dielectric material member is made from printed circuit board material and the first coupled lines are in the form of printed lines on opposing major surfaces of the first dielectric material member. There may be additional dielectric material members located within the interior space defined by the conductive member. For example, additional layers of circuit board material may be located over the outwards-facing surfaces of the first dielectric member and its printed lines.

According to one aspect of the present invention, a balun circuit includes: a first pair of coupled lines; a first balanced port; a first unbalanced port; a first re-entrant box; and a first ferrite member. The first ferrite member is made of material which is ferrimagnetic and non-electrically-conductive. The first pair of coupled strip lines is electrically connected to the first balanced port and the first unbalanced port. The first re-entrant box includes an exterior surface and is made from electrically conductive material. The first re-entrant box field-encloses the first pair of coupled strip lines. The first re-entrant box is not electrically connected to the first pair of coupled lines. The first ferrite member includes an interior surface and defines an interior space. The first pair of coupled strip lines and the first re-entrant box are located at least substantially within the interior space of the first ferrite member.

According to a further aspect of the present invention, a balun circuit includes: a first pair of coupled lines; a first balanced port; a first unbalanced port; a first electrically conductive member; and a first magnetic-material member. The first pair of coupled lines is electrically connected to the first balanced port and the first unbalanced port. The first electrically conductive member includes an exterior surface. The first electrically conductive member field-encloses the first pair of coupled lines. The first electrically conductive member is not electrically connected to the first pair of coupled lines. The first magnetic-material member includes an interior surface and defines an interior space. The first pair of coupled lines and the first electrically conductive member are located at least substantially within the interior space of the first magnetic material member.

According to a further aspect of the present invention, a method of making a carrier-substrate-mounted balun includes a "forming" step, an "inserting" step and an "attaching" step. The forming step involves forming, by printed circuit board construction techniques, an electrically conductive enclosure sub-assembly including: a first plurality of printed circuit board members, a first pair of coupled strip lines, a first balanced port, a first unbalanced port, and a first electrically conductive member. the inserting step involves inserting at least a substantial portion of the first electrically conductive enclosure sub-assembly into a recess in a first magnetic-material member to form a magnetically-enclosed sub-assembly. the attaching step involves attaching the magnetically-enclosed sub-assembly to a first substrate to form a carrier-substrate-mounted balun. The first electrically conductive member has an exterior surface and defines an interior space. The interior space of the first electrically conductive member is at least substantially filled by the first pair of coupled strip lines and the plurality of printed circuit board members. At the forming step, the electrically conductive member is formed, at least in part, by coating peripheral edges of the plurality of printed circuit boards with electrically conductive material.

BRIEF DESCRIPTION OF THE DRAWINGS

The present invention will be more fully understood and appreciated by reading the following Detailed Description in conjunction with the accompanying drawings, in which.

DETAILED DESCRIPTION OF THE INVENTION

As a preliminary note, the embodiment(s) of the present invention that are about to be discussed will be generally be baluns with a 1:1 impedance transformation, it will be understood by those of skill in the art that many inventive aspects of the present invention could be applied to baluns having other impedance ratios, such as a 1:4 balun. Also, while it is preferred that the coupled lines be in the form of generally planar strip lines, and, more specifically, in the form of strip lines oriented so that their major surfaces face each other (that is, a broadside orientation), it should be understood that other types of coupled lines and/or other orientations (now known or to be developed in the future) may be possible.

The present invention recognizes that coupled lines should be designed as physically short as possible while still achieving good balun performance. This shortness will allow for the smallest packaging and lowest insertion loss.

Figure 1A:
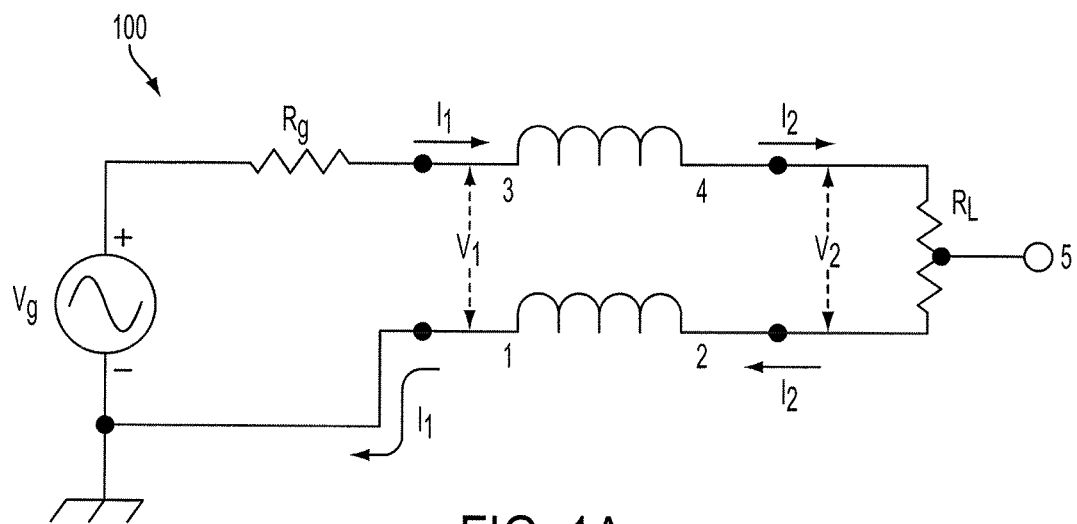
FIG. 1A is a schematic view of a portion of a first embodiment of a balun according to the prior art.
Figure 1B:
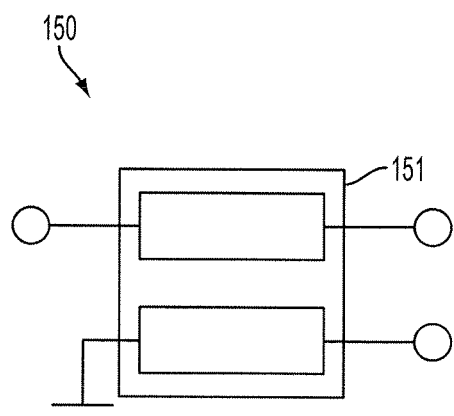
FIG. 1B is a schematic view of the first embodiment prior art balun.
Figure 2A:
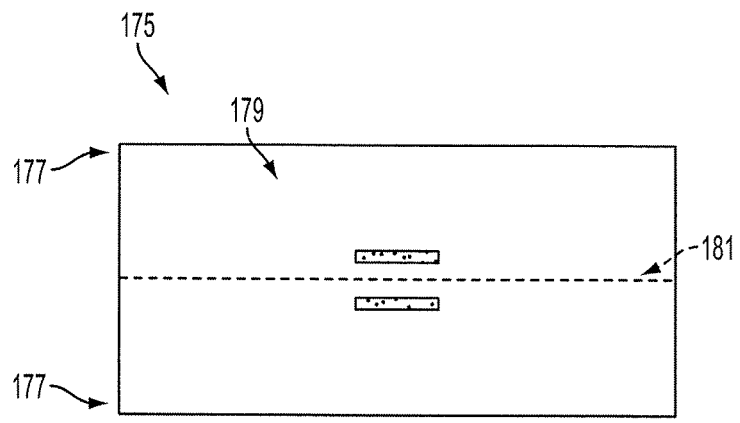
FIG. 2A is a cross-sectional (cross-hatching omitted for clarity of illustration purposes), schematic view of a portion a second embodiment of a balun according to the prior art.
Figure 2B:
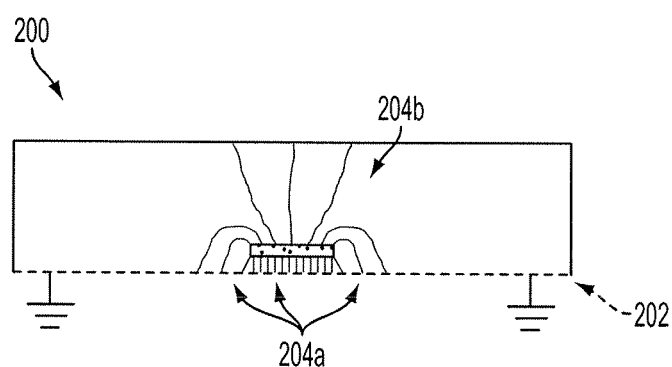
FIG. 2B is a cross-sectional (cross-hatching omitted for clarity of illustration purposes), schematic view of a portion the second embodiment prior art balun as it operates in odd mode.
Figure 2C:
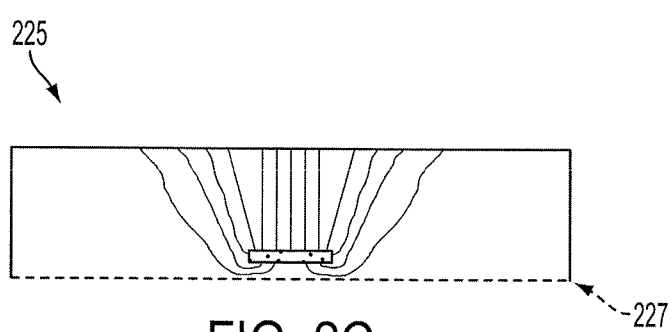
FIG. 2C is a cross-sectional (cross-hatching omitted for clarity of illustration purposes), schematic view of a portion the second embodiment prior art balun as it operates in even mode.
Figure 3A:
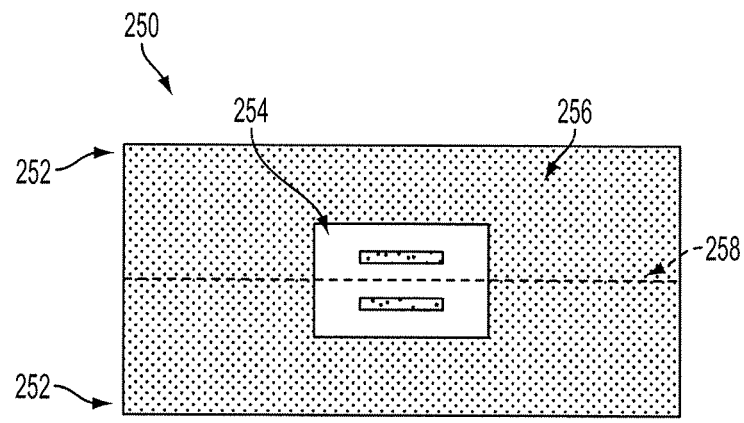
FIG. 3A is a cross-sectional (cross-hatching omitted for clarity of illustration purposes), schematic view of a portion a third embodiment of a balun according to the prior art.
Figure 3B:
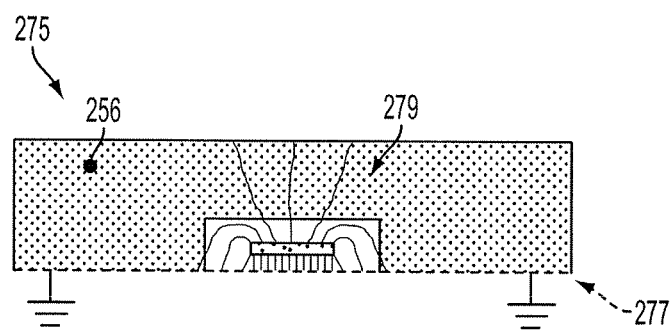
FIG. 3B is a cross-sectional (cross-hatching omitted for clarity of illustration purposes), schematic view of a portion the third embodiment prior art balun as it operates in odd mode.
Figure 3C:
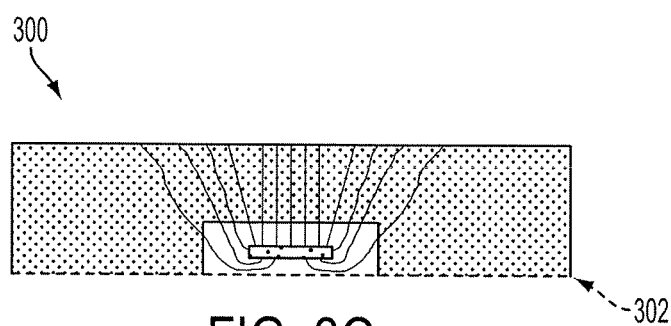
FIG. 3C is a cross-sectional (cross-hatching omitted for clarity of illustration purposes), schematic view of a portion the third embodiment prior art balun as it operates in even mode.

As shown in schematic 275 of prior art FIG. 3B, some of the odd mode field lines 279 extend significantly through the volume of ferrite material 256. Because the ferrite material is lossy, this will introduce energy loss in the odd mode, an undesirable side effect of using the ferrite material. The loss in the ferrite is actually desirable for the even mode at the higher frequencies. In preferred embodiments of the present invention, however, there is a conductive layer. The odd mode electric fields can be prevented from entering the ferrite material by using the conductive layer of the present invention.

Figure 4A:
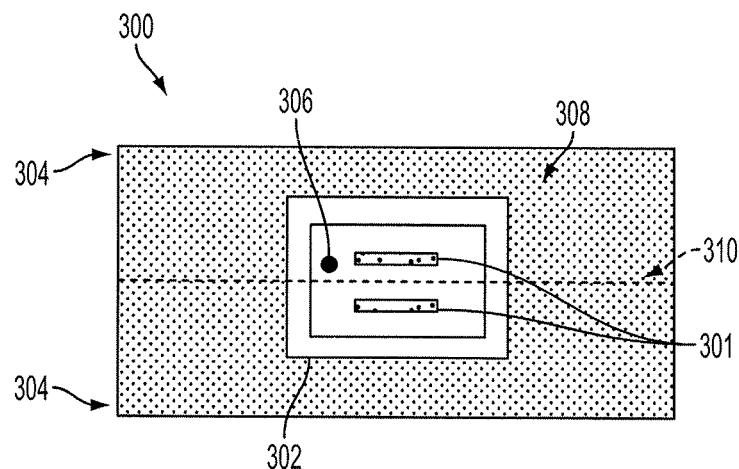
FIG. 4A is a cross-sectional (cross-hatching omitted for clarity of illustration purposes), schematic view of a portion a first embodiment of a balun according to the present invention.
Figure 4B:
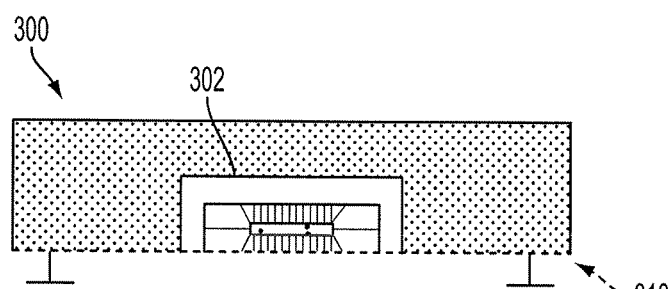
FIG. 4B is a cross-sectional (cross-hatching omitted for clarity of illustration purposes), schematic view of a portion the first embodiment balun as it operates in odd mode.
Figure 4C:
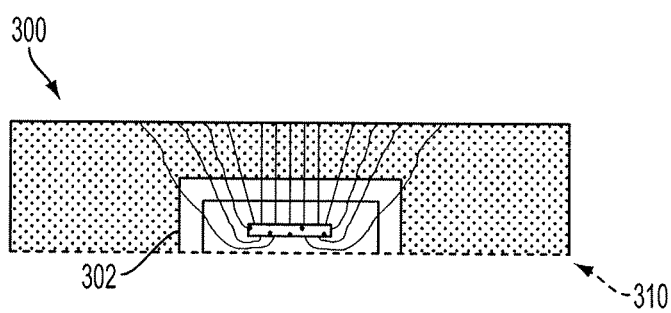
FIG. 4C is a cross-sectional (cross-hatching omitted for clarity of illustration purposes), schematic view of a portion the first embodiment balun as it operates in even mode.

As shown in FIGS. 4A, 4B and 4C balun 300 includes: broadside-oriented coupled lines 301; conductive box (also called re-entrant coupler) 302; ground planes 304; dielectric material 306; ferrite material 308; and plane of symmetry 310. In FIG. 4B, the top half of the balun is shown in odd mode and plane symmetry 310 is acting as a perfect electric wall. In FIG. 4C, the top half of the balun is shown in even mode and plane symmetry 310 is acting as a perfect magnetic wall.

FIG. 4A illustrates the transverse cross section of re-entrant coupler 302 surrounded by ferrite material 308. The re-entrant coupler is in the form of a conductive box that has been added around coupled lines 301 and dielectric material 306. The box extends for the length of the coupled lines but preferably makes no electrical connection to any other conductors. In the odd mode, this box is electrically connected to the virtual ground at the plane of symmetry, which at least substantially contains all of the fields within the transverse footprint of the box as shown in FIG. 4B. Substantially no odd mode fields are present in the ferrite material and therefore the odd mode will not lose any energy in the ferrite. Also, the re-entrant box gives the odd mode more capacity per given line width allowing for the use of narrower traces to achieve the desired odd mode impedance. Having narrower lines will increase the Zeven, which is a desired effect.

In the even mode (see FIG. 4C), the plane of symmetry is not a virtual ground but is a perfect magnetic wall. Therefore the electrical voltage of the box is "floating" and the box has no net charge. However, the charge distribution on the inside of the box is slightly different than it is on the outside of the box. The effect of having the conductive box present in the even mode is negligible.

So, the use of the re-entrant box has a positive impact on reducing insertion loss (keeping the odd mode out of the ferrite) and increasing Zeven (allowing narrower lines). Also, the primary location of loss in the balun will generally be in the ferrite material, which is a good thermal conductor (unlike the dielectric material).

Figure 12:
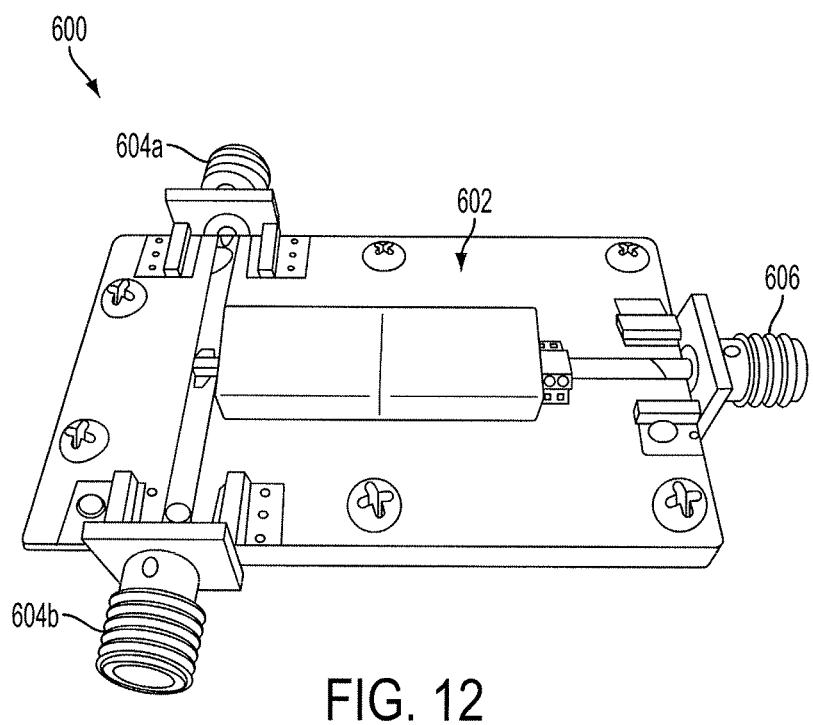
FIG. 12 is a perspective view of a third embodiment of a balun according to the present invention.

As shown in FIG. 12, an embodiment of a detachably-connectable balun 600 according to the present invention was actually constructed as a prototype. This balun 600 is called a "detachably-connectable balun" because its balanced and unbalanced ports are structured so that they are suitable for electrically connecting to standard detachably-attachable electrical connectors (in the case of balun 600, SMA connectors). FIG. 12 actually was a substrate-connectable balun (like balun 500, discussed above), but the addition of the SMA connectors at its balanced and unbalanced ports has transformed it into a detachably-connectable balun. As further shown in FIG. 12, balun 600 includes: magnetic-material-enclosed sub-assembly 602; first balanced port 604a; second balanced port 604b; and unbalanced port 606. The coupled line sub-assembly is generally similar to the balun discussed above in connection with FIG. 4A.

Balun 600 is a 1:1 balun with port impedances (Zunbal and Zbal) of 50 ohms was designed and manufactured. As will be appreciated by those of skill in the art, baluns with other port impedances, having the coupled lines and re-entrant coupler that characterizes at least some embodiments of the present invention, can easily be designed based on the disclosures made herein. From Eq. (2), the required odd mode impedance, Zodd, is 25 ohms. The odd mode is entirely contained within the dielectric material so dimensions for the coupled lines could be found when the dielectric material was defined. The coupled line structure can be designed using standard high frequency printed circuit board material with: (i) an $\in_r$ value preferably in the range of 2-10; and (ii) a loss tangent <0.05. More specifically, balun 600 was constructed using dielectric material with: (i) $\in_r$=3.5; and (ii) loss tangent=0.03. Balun 600 was made to have the following dimensions: (i) the distance between the two strips was 0.02 inches; (ii) the distance from the top strip to the top ground was 0.01"; (iii) the distance from the bottom strip to the bottom ground is 0.01 inches; (iv) the distance from each strip to the plane of symmetry was 0.01 inches; (v) the width of the dielectric material was 0.05 inches; and (vi) the aperture in the ferrite material was slightly larger than the size of the dielectric, including the conducting box, allowing a 0.003 inch air gap (nominally). The line width was calculated to be 0.0275" inches for Zodd=25 ohms. The coupled lines would have a physical length of 1 inch, a starting point for the analysis that was carried through to the prototype part.

In balun 600, the ferrite material was selected with the following characteristics: (i) $\in'\approx 11$ (flat with frequency from 10 MHz to 2 GHz); (ii) $\in''\approx 0.25$ (flat with frequency from 100 MHz to 2 GHz, 0.9 maximum value below 100 MHz); (iii) $\mu'\approx 250$ at 10 MHz (dropping quickly to 25 at 100 MHz and down to 0.2 by 1000 MHz); (iv) $\mu''$200 at 10 MHz (dropping to 80 at 100 MHz and to 8 by 1000 MHz); and (v) at frequencies above 20 MHz, $\mu''>\mu'$. More specifically, in balun 600, the magnetic material was chosen to be 52 ferrite material.

At the lower frequencies, the high $\mu'$ increases the even mode impedance and the electrical length. This allows the coupled lines to be physically short and still have good balun performance down in the low frequency range. At the upper end of the frequency band, the effects of $\mu'$ are not as significant and the increased ratio of $\mu''/\mu'$ (or loss) tends to reduce the common mode currents. This loss allows the balun to have good performance even when the even mode has an electrical length of 180 degrees.

Figure 7:
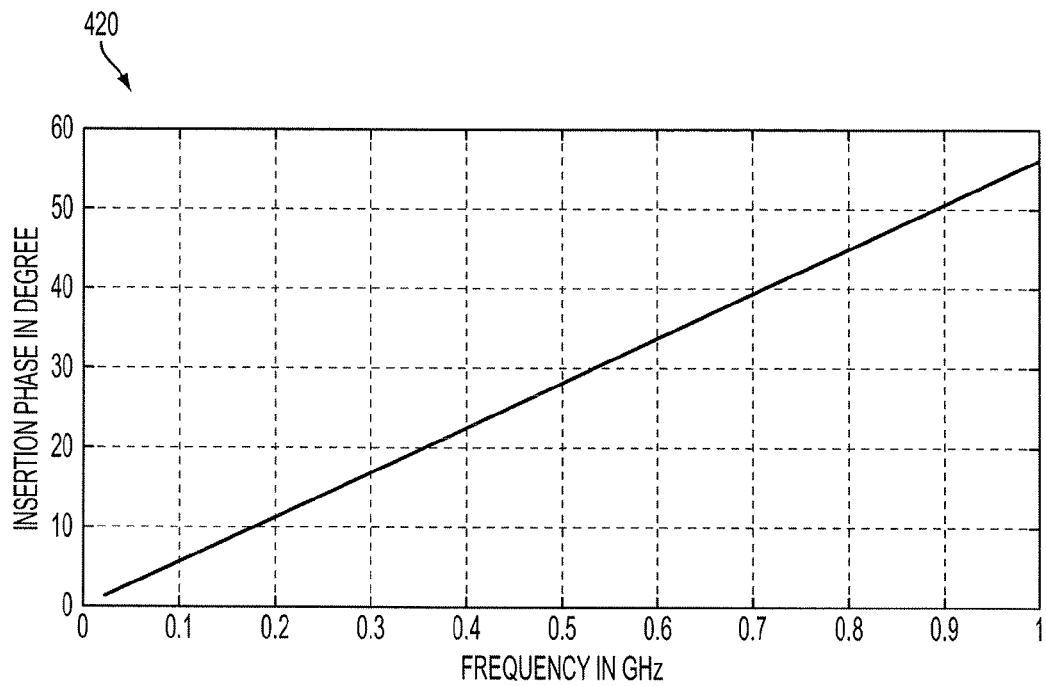
FIG. 7 is a graph which helps to show balun performance according to the present invention.
Figure 8:
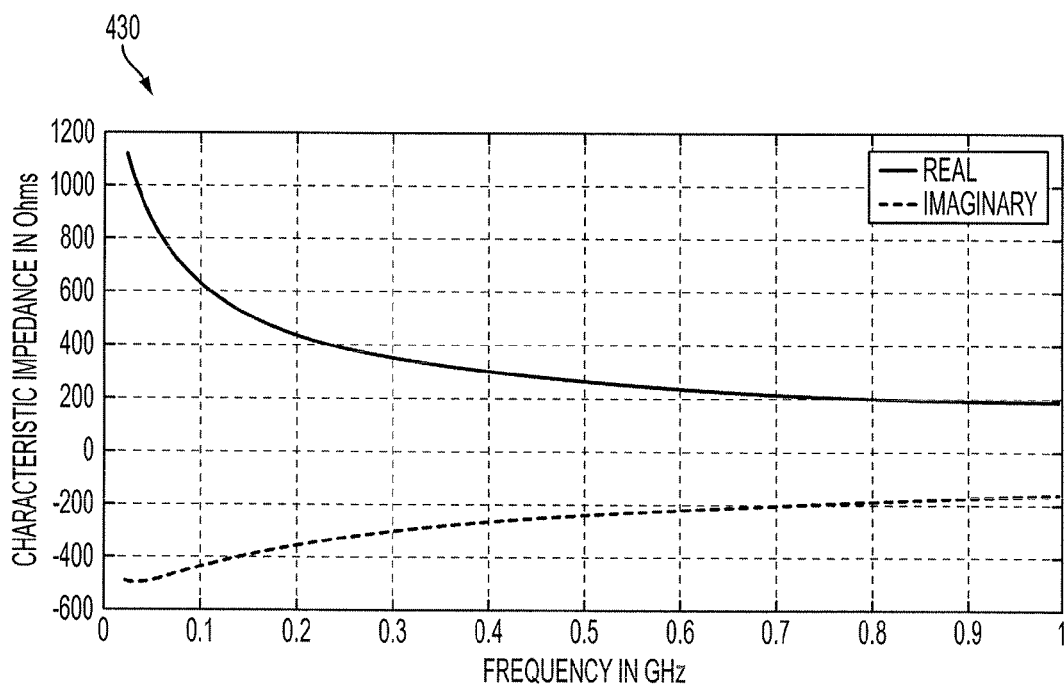
FIG. 8 is a graph which helps to show balun performance according to the present invention.

A rectangular conformal transformation was used to convert from the cross sectional geometry to inductance and capacitance per unit length. These values change with frequency due to the material characteristics changing with frequency. The distributed inductance and capacitance are then used to calculate the complex even and odd mode impedances, insertion loss and insertion phase for the coupled line structure of balun 600. These values are plotted in FIG. 5 (graph 400, relating to odd mode performance), FIG. 6 (graph 410, relating to odd mode performance), FIG. 7 (graph 420, relating to odd mode performance), FIG. 8 (graph 430, relating to even mode performance), FIG. 9 (graph 440, relating to even mode performance), and FIG. 10 (graph 450, relating to even mode performance).

Figure 5:
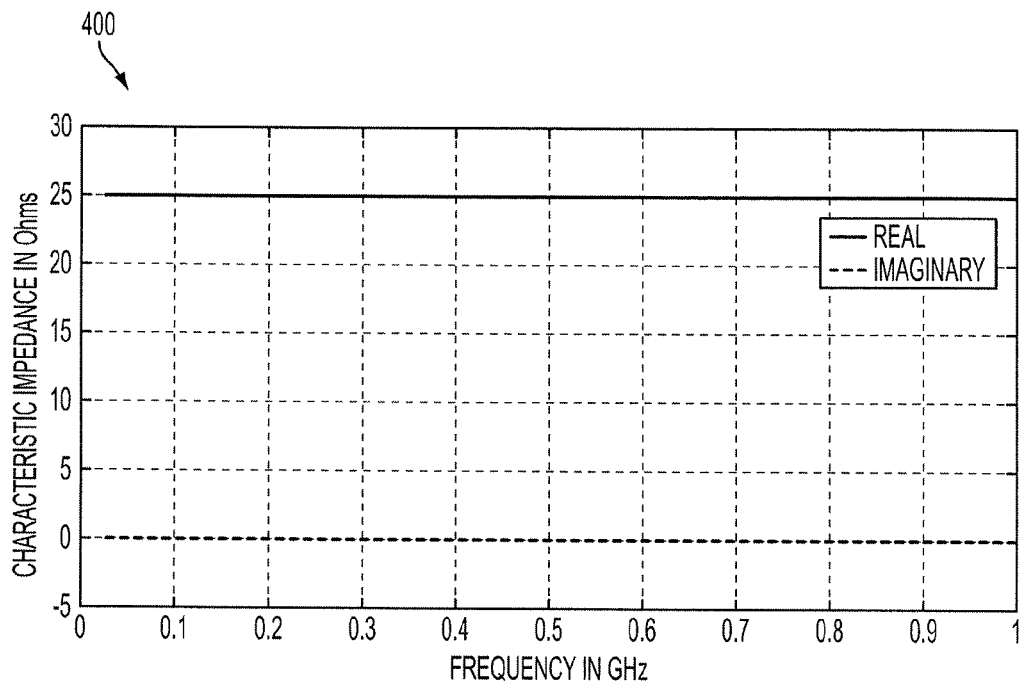
FIG. 5 is a graph which helps to show balun performance according to the present invention.
Figure 6:
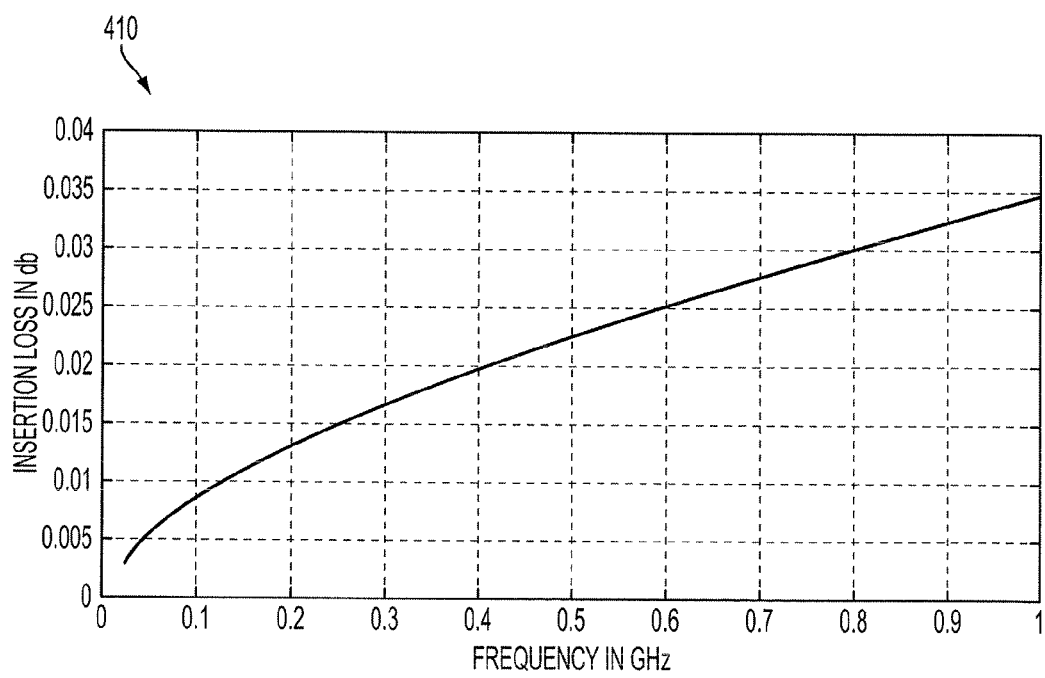
FIG. 6 is a graph which helps to show balun performance according to the present invention.

In FIG. 5, it can be seen that the real part of the odd mode impedance (Zodd) is 25 ohms and flat with frequency. This is expected from dielectric material that has an $E_r$ value that is constant with frequency. The imaginary part is very small, which reflects the low loss characteristics of the material. It should be kept in mind that substantially all of the odd mode electric field is contained within the dielectric material and not exposed to the ferrite. FIG. 6 shows the insertion loss versus frequency for the 1 inch line, which insertion loss does increase with frequency but is still a very small number. The odd mode insertion phase is linear with frequency as expected, and is plotted in FIG. 7.

Figure 9:
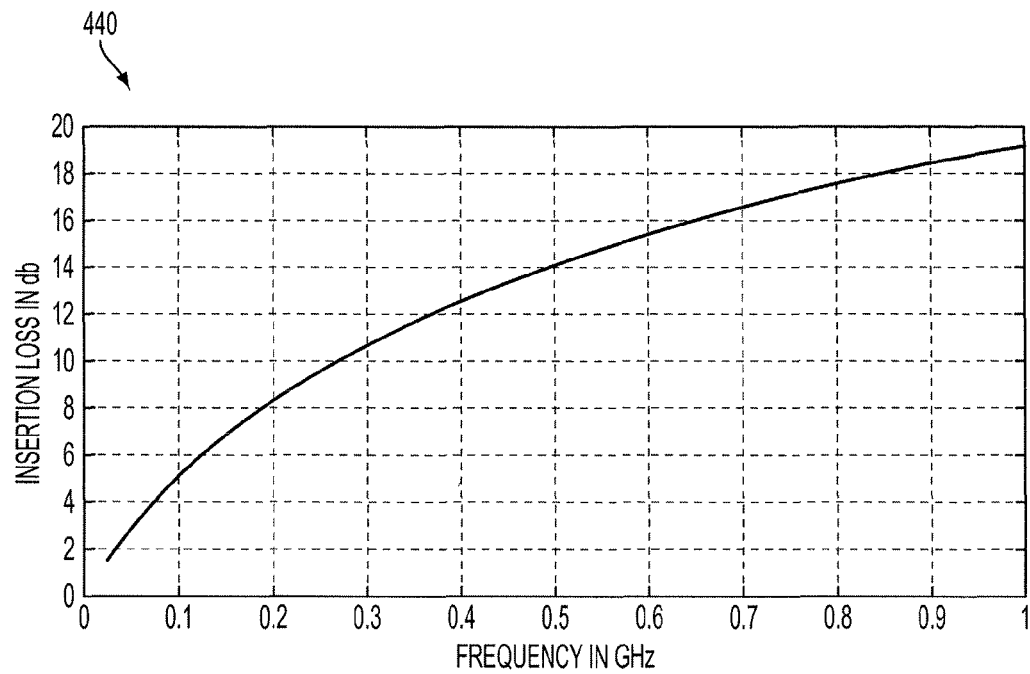
FIG. 9 is a graph which helps to show balun performance according to the present invention.
Figure 10:
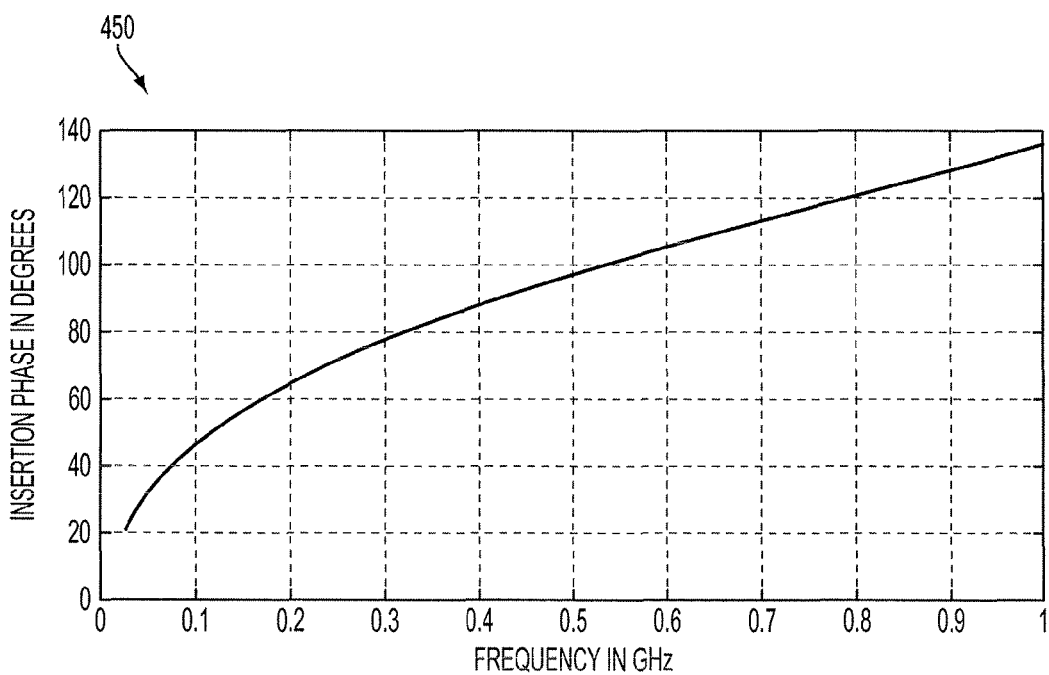
FIG. 10 is a graph which helps to show balun performance according to the present invention.

In the even mode there is an electric field and energy is located in the ferrite (see FIG. 4C). Accordingly, even mode behaves quite differently from odd mode. The even mode complex impedance (Zeven) can be seen in FIG. 8. Notice that the angle of the complex value is increasing with frequency. This angle represents the loss in the ferrite. This type of response is desired for the coupled line balun being designed here and is consistent with the ferrite material properties described above. FIG. 9 illustrates that the insertion loss in the even mode is significant and increasing with frequency. Again, this is the desired result and was anticipated based on the ferrite material properties. Finally, the scaling of the insertion phase due to the ferrite is seen in FIG. 10. The insertion phase, or electrical length, is increased by the presence of the ferrite ($\mu$). There is more increase in electrical length at the lower frequencies because $\mu'$ is higher at the lower frequencies.

It is worth noting that the insertion phase is quite different for the two modes (even and odd). The actual insertion phase of the balun is almost exactly the same as the odd mode insertion phase of the coupler. The even mode insertion phase is not as important due to the high loss of the even mode. Also, increasing the physical length of the coupled lines does improve the balun performance at the lower frequencies while somewhat degrading the higher frequency performance. As will be appreciated by those of skill in the art: (i) the proper length for the desired frequency band must be determined through analysis and simulation; and (ii) some trade-off of performance and size will be required.

Thus far, the analysis has focused on the two broadside coupled lines, the dielectric material portion, and the re-entrant coupler. However, practical, usable balun circuits generally require some way of connecting the four nodes of the coupled lines to the larger circuit in which the balun circuit will be used. Examples of various interfaces for providing these balun ports are shown in FIGS. 11 to 14. The size, shape and structure of the balun ports will have an impact on the balun performance and must be given serious consideration, as will be appreciated by those of skill in the balun design art.

Figure 11A:
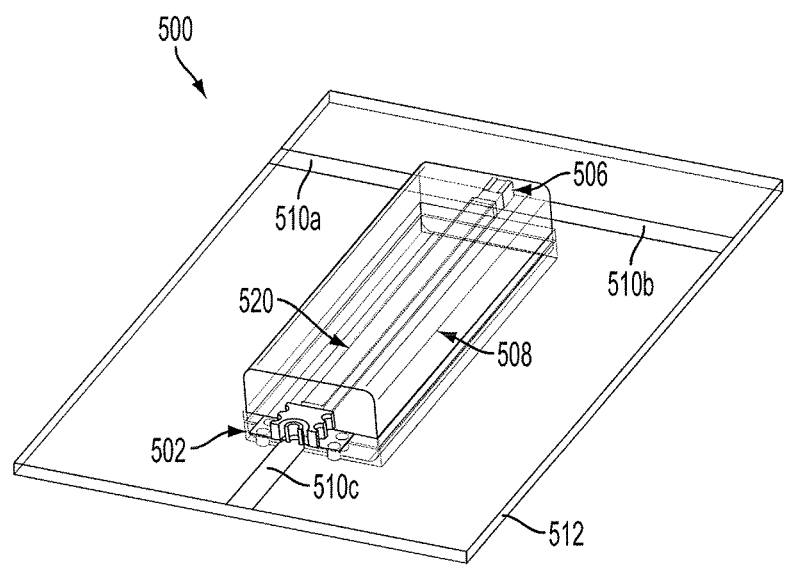
FIG. 11A is a perspective view of a second embodiment of a balun according to the present invention.
Figure 11B:
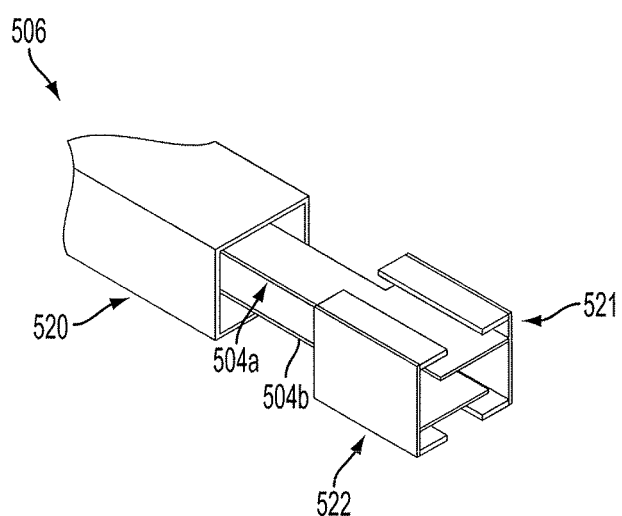
FIG. 11B is a perspective view of a portion the second embodiment balun.
Figure 11C:
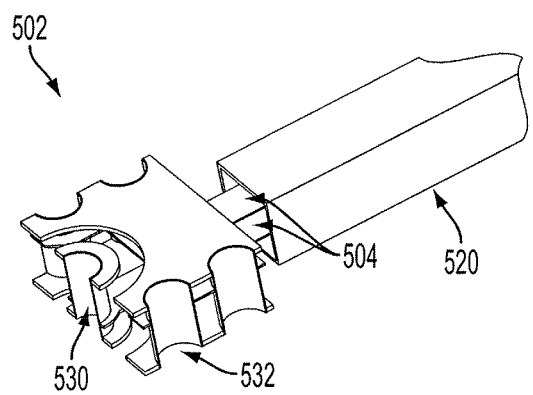
FIG. 11C is a perspective view of a portion the second embodiment balun.

As shown in FIGS. 11A,B,C, substrate-connectable balun 500 includes: unbalanced port 502; substrate-mounted coupled lines 504; balanced port 506; ferrite material portion 508; microstrip traces 510a,b,c; circuit board 512; re-entrant box 520; first terminal 521; second terminal 522; unbalanced port center connector 530; and ground connections 532. In balun 500: (i) first terminal 521 is electrically connected to microstrip trace 510a; (ii) second terminal is electrically connected to microstrip trace 510b; (iii) unbalanced port center connector 530 is electrically connected to microstrip trace 510c; (iv) ground connections are electrically connected to an electrical ground (not separately shown); and (v) coupled line 504a is electrically connected first terminal 521; and (vi) coupled line 504b is electrically connected to second terminal 522. In FIGS. 11B and 11C, the dielectric material that fills the re-entrant box and surrounds the coupled lines (see FIG. 4A) has been omitted for clarity of illustration purposes. Preferably, this dielectric material is made of PCB board material and the coupled lines and dielectric are formed by PCB board technology processes, such as etching copper away and stacking PCB boards. Balun 500 is referred to as a "substrate-connectable balun" because its balanced and unbalanced ports are structured so that they are suitable for electrically connecting to electrical paths on one or more further substrates. For example, balun 500 may be connected to a PCB (not shown) as a surface mounted component.

Balun 500 corresponds to the HFSS (High Frequency Structural Simulation) model used for simulating the electrical performance of the balun. The coupled lines extend along the length of the narrow re-entrant box 520. At one end, the two coupled lines are connected directly to pads which make up balanced port 506 of the balun. At the other end, the circuit is expanded to allow for the ground connection (which ground connection is herein considered as a port) and the unbalanced port connection. The circuit and the re-entrant box are inserted into the ferrite material (in any appropriate order of assembly) and the terminals of the balun are connected to microstrip traces 510a,b,c on circuit board 512. Preferably, the order of assembly is as follows: (i) the coupled lines 504, dielectric material and re-entrant box 520; first terminal 521, second terminal 522, unbalanced port center connector 530 and connections to ground plane 532 to form a coupled line circuit sub-assembly are formed and/or assembled (preferably by PCB construction technology methods) to form a re-entrant box sub-assembly; (ii) the re-entrant box sub-assembly is inserted into a through-hole in ferrite material portion 508 to form a magnetic-material-enclosed sub-assembly (preferably there should be a snug fit between the exterior surface of the re-entrant box and the interior surface of the ferrite material so that these surfaces contact each other over substantially their entire respective areas); and (iii) magnetic material enclosed sub-assembly is assembled to board 512 and microstrip traces 510a,b,c and electrical ground. In preferred assembly methods according to the present invention, the magnetic-material-enclosed sub-assembly is soldered to a printed circuit board where the connections can be made to the ports.

Figure 13:
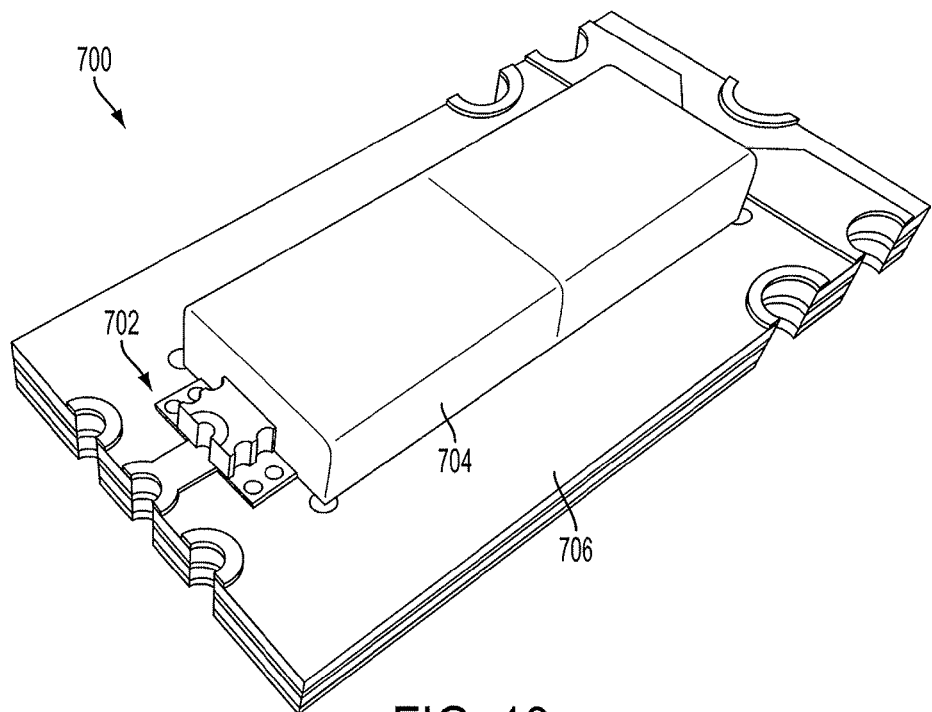
FIG. 13 is a perspective view of a fourth embodiment of a balun according to the present invention.
Figure 14:
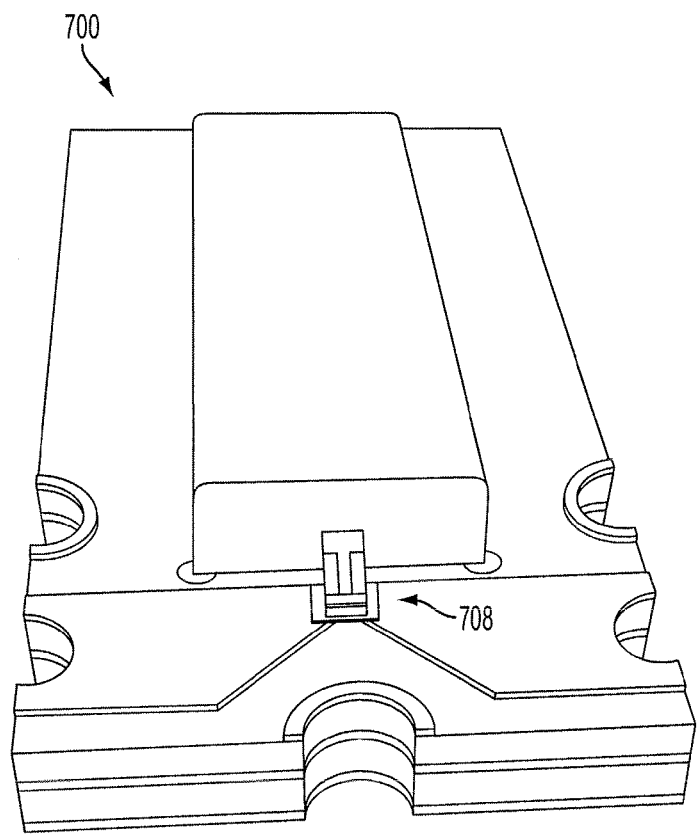
FIG. 14 is a perspective view of the fourth embodiment balun.

FIGS. 13 and 14 show substrate-connectable balun circuit 700, including: unbalanced port 702; magnetic-material-enclosed sub-assembly 704; substrate 706; and balanced port 708. Substrate-connectable balun 700 is soldered to a carrier substrate Preferably this carrier substrate will be mounted to another circuit board as a surface mount component.

The proposed balun could be delivered to the end user as simply the circuit inserted and captivated in the ferrite. This would appear as a ferrite shell with PCB-connectable terminals sticking out of its opposite ends. As such, this would be a form of a substrate-connectable balun. However, in some applications, this kind of embodiment of the present invention may present some assembly challenges to the user. In order to achieve the best possible configuration for performance and ease of installation (for the user), further packaging must be considered. One example of such packaging is illustrated in FIGS. 13 and 14. More specifically, in balun circuit 700, the magnetic-material-enclosed sub-assembly and its associated ports are installed in a "carrier" circuit on a carrier substrate. The user can handle this component as a surface mount device with "castellated" vias (via cylinders cut in half) for making solder connections to the traces. In other words, it may be easier for the user to make further electrical connections to a larger circuit using the vias, rather than by connecting directly to the ports at the ends of the coupled lines.

Figure 15:
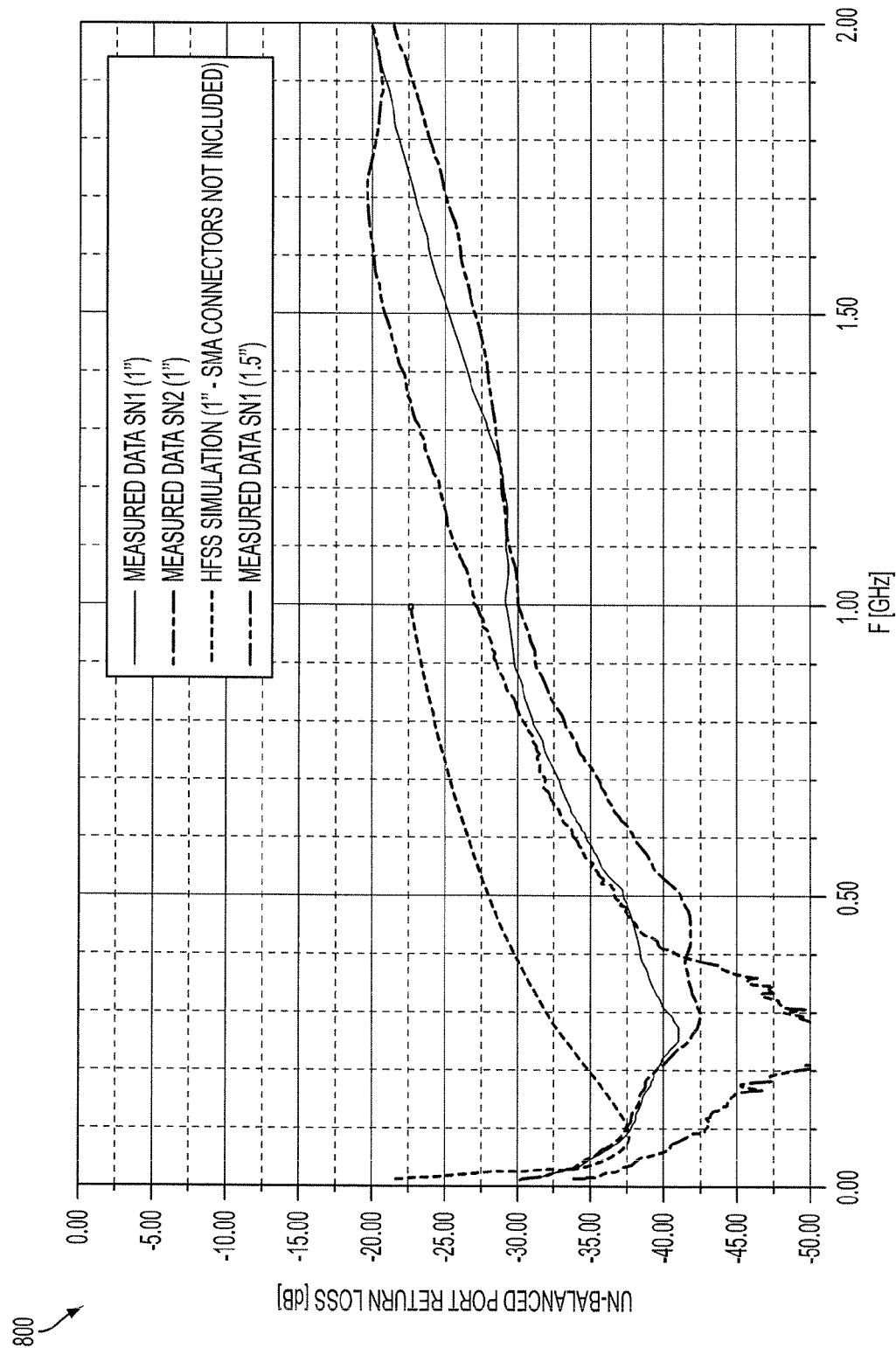
FIG. 15 is a graph which helps to show balun performance according to the present invention.
Figure 16:
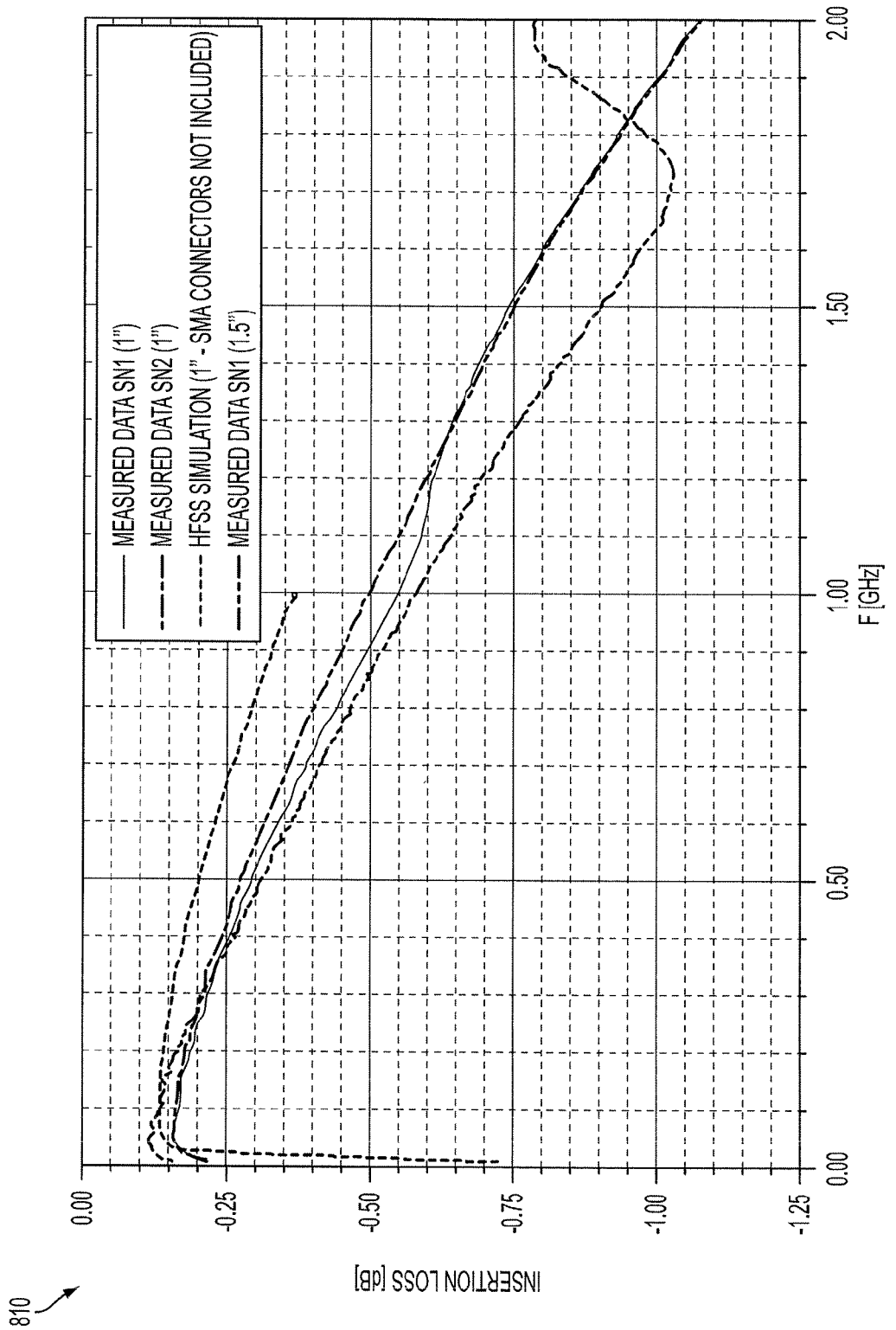
FIG. 16 is a graph which helps to show balun performance according to the present invention.
Figure 17:
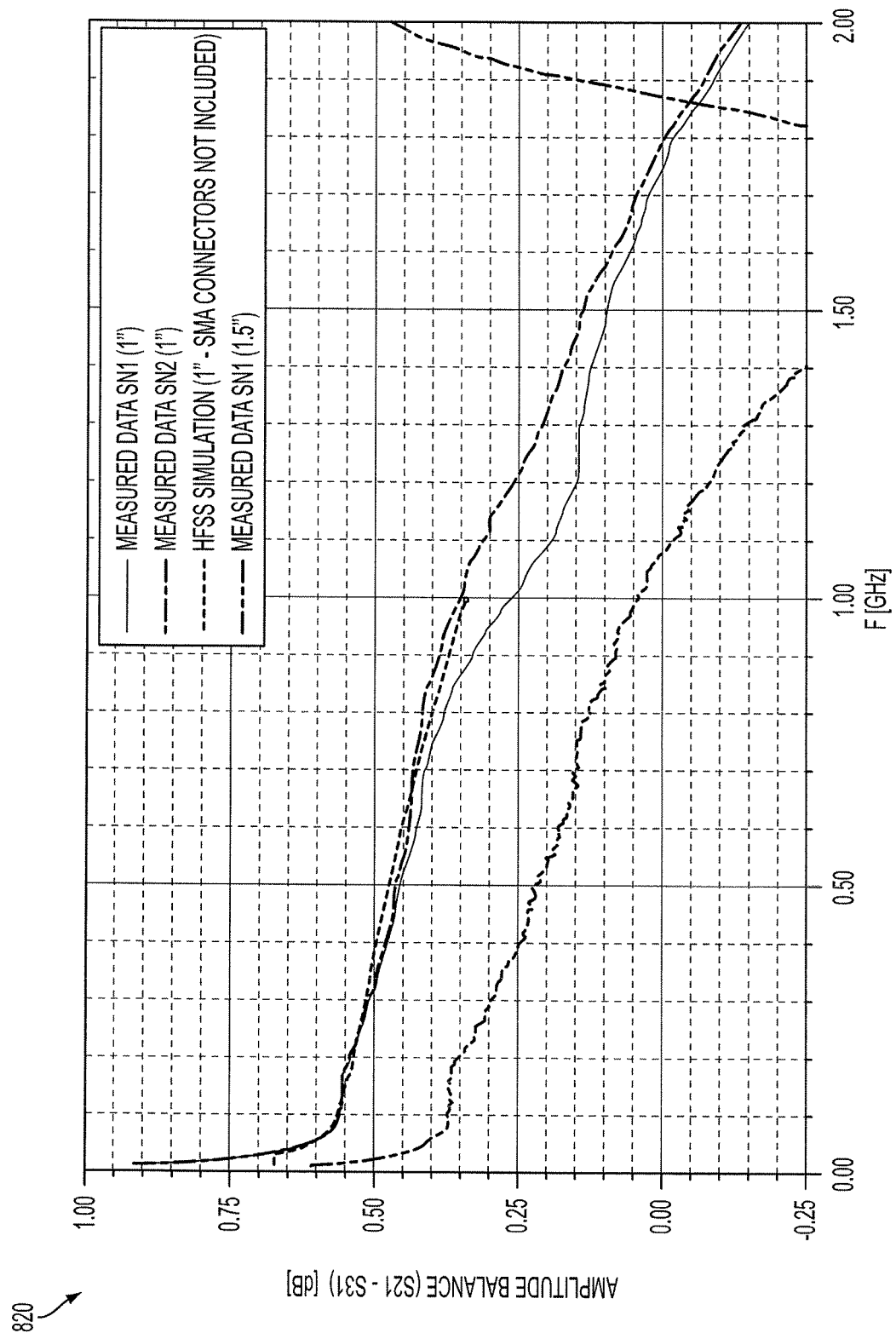
FIG. 17 is a graph which helps to show balun performance according to the present invention.
Figure 18:
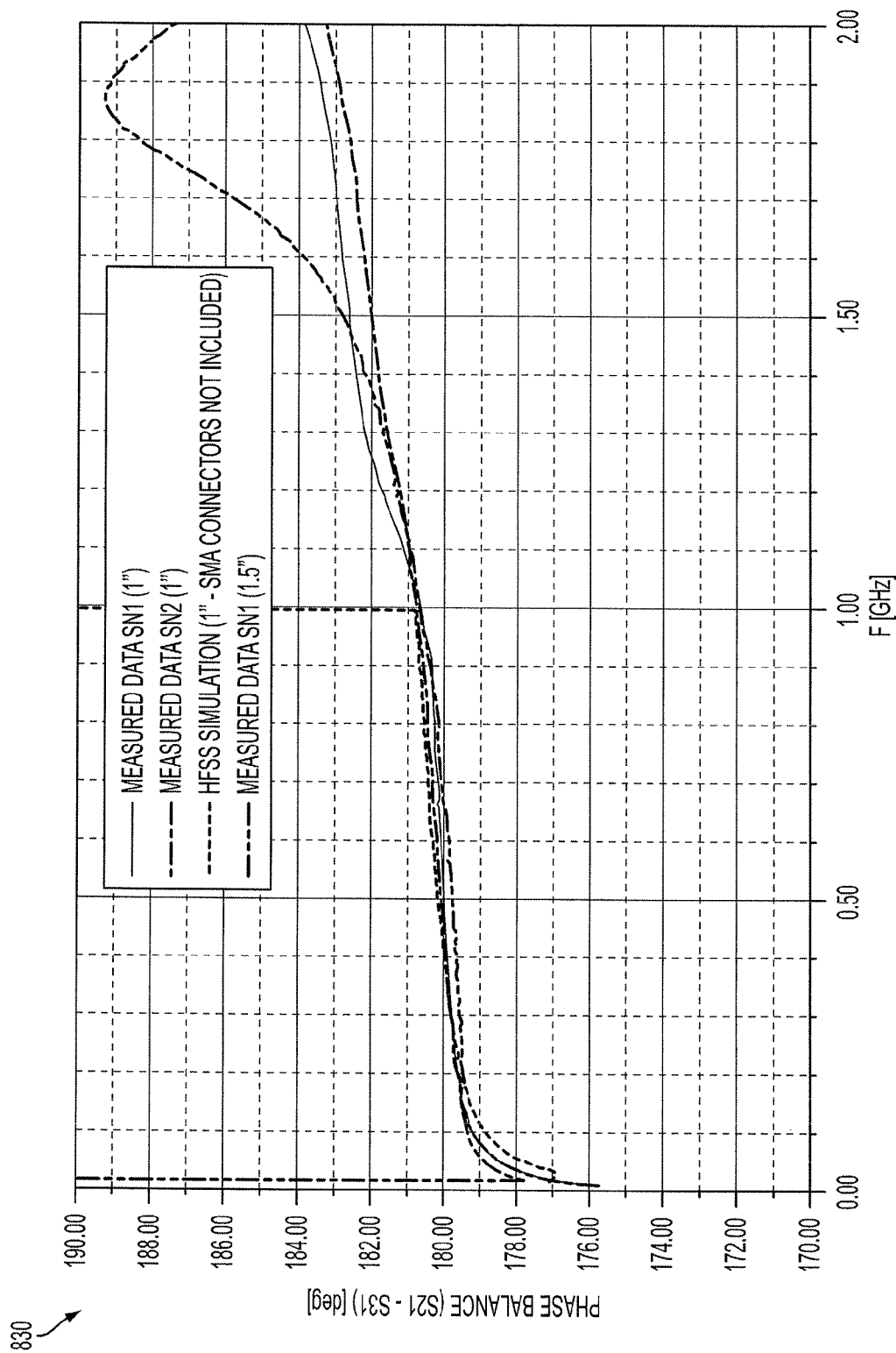
FIG. 18 is a graph which helps to show balun performance according to the present invention.
Figure 19:
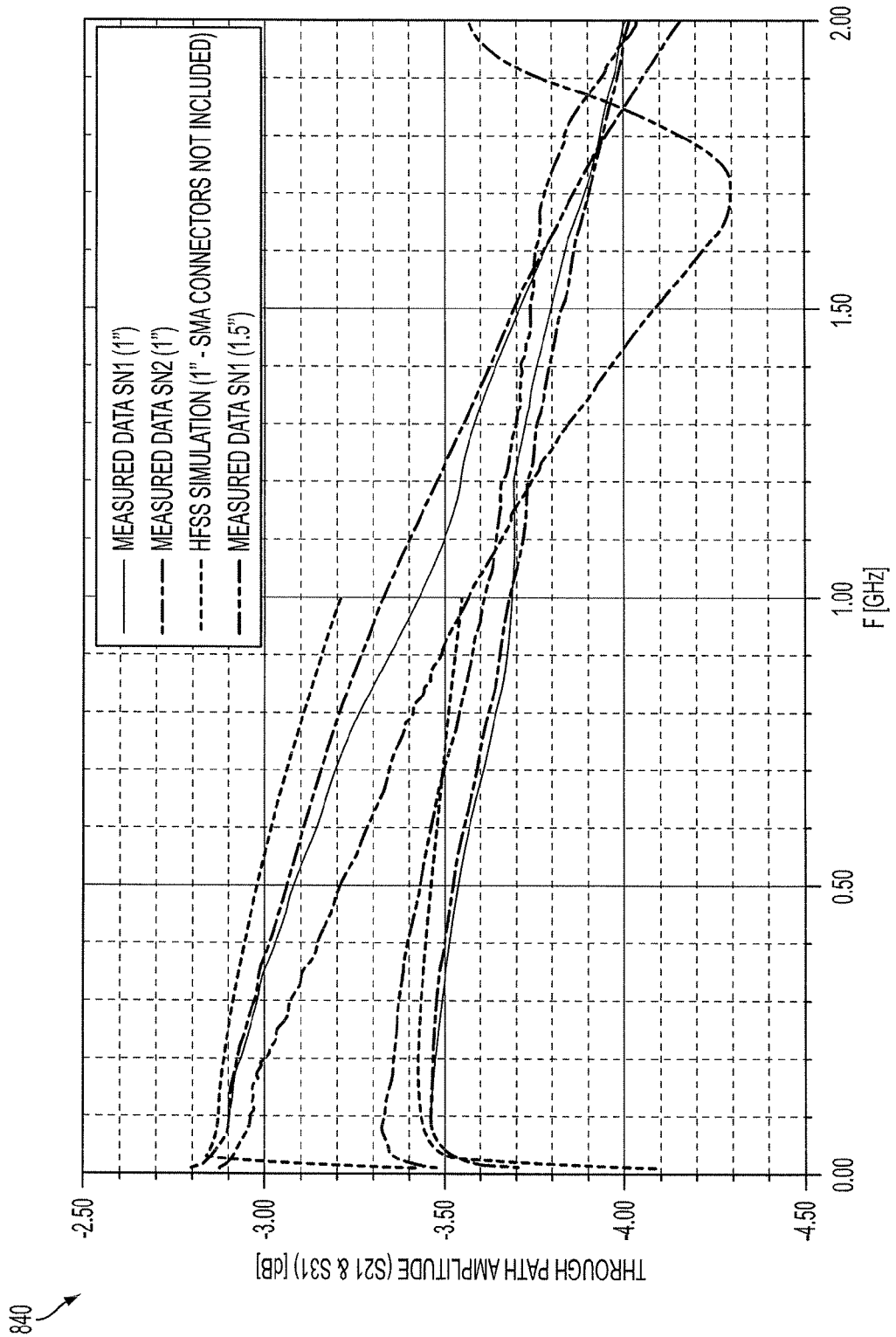
FIG. 19 is a graph which helps to show balun performance according to the present invention.
Figure 20:
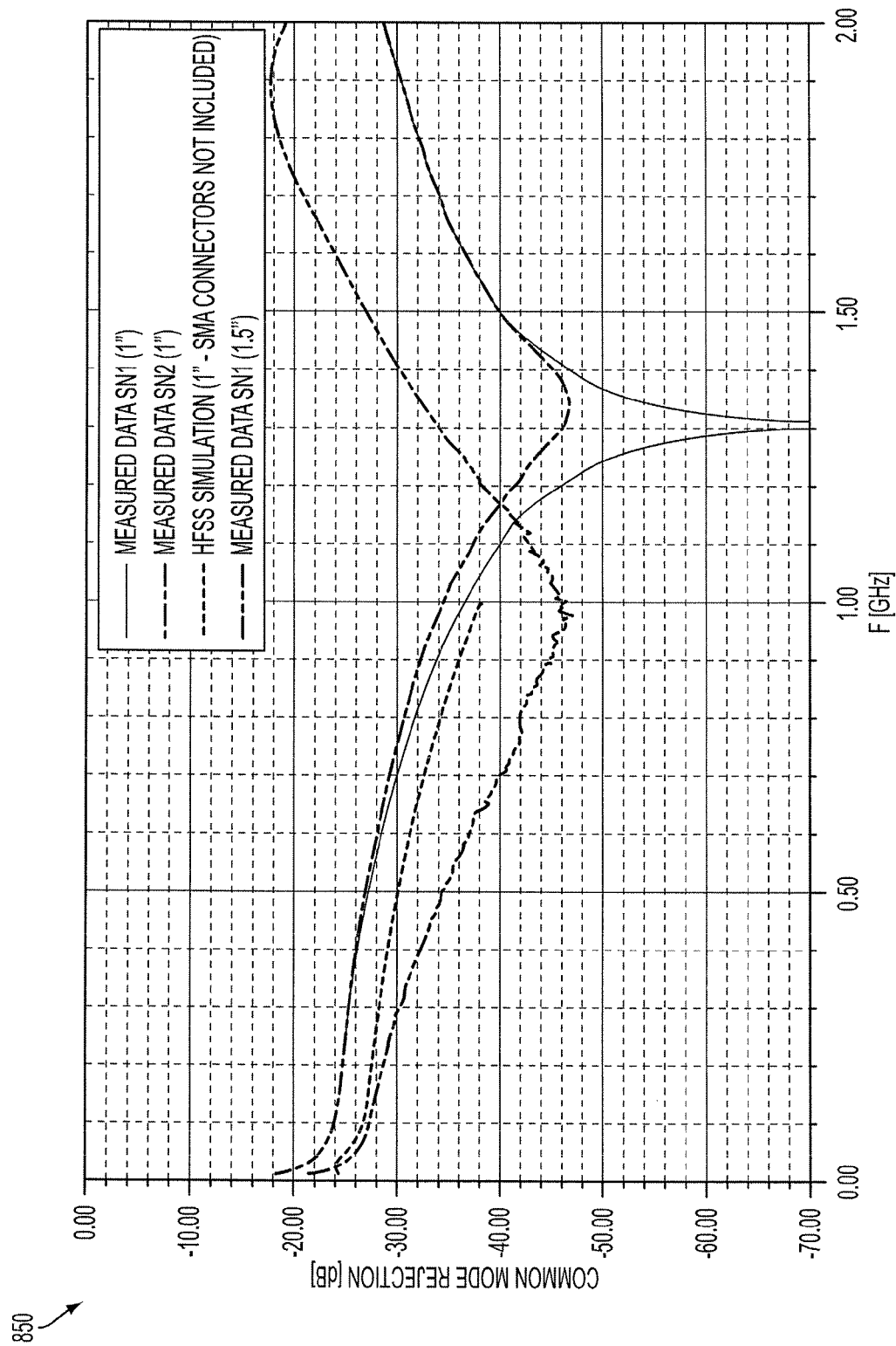
FIG. 20 is a graph which helps to show balun performance according to the present invention.

The electrical performance of prototype baluns (similar to balun 700) have been evaluated and the test results are shown in the following plots: FIG. 15 (graph 800), FIG. 16 (graph 810), FIG. 17 (graph 820), FIG. 18 (graph 830), FIG. 19 (graph 840), and FIG. 20 (graph 850). Included in the plots are the simulation results for the 1 inch long balun and the measured results from a second balun that was prototyped at 1.5 inch length. It is noted that these simulation results do not include the SMA connectors.

DEFINITIONS

Any and all published documents mentioned herein shall be considered to be incorporated by reference, in their respective entireties. The following definitions are provided for claim construction purposes:

Present invention: means "at least some embodiments of the present invention," and the use of the term "present invention" in connection with some feature described herein shall not mean that all claimed embodiments (see DEFINITIONS section) include the referenced feature(s).

Embodiment: a machine, manufacture, system, method, process and/or composition that may (not must) be within the scope of a present or future patent claim of this patent document; often, an "embodiment" will be within the scope of at least some of the originally filed claims and will also end up being within the scope of at least some of the claims as issued (after the claims have been developed through the process of patent prosecution), but this is not necessarily always the case; for example, an "embodiment" might be covered by neither the originally filed claims, nor the claims as issued, despite the description of the "embodiment" as an "embodiment."

First, second, third, etc. ("ordinals"): Unless otherwise noted, ordinals only serve to distinguish or identify (e.g., various members of a group); the mere use of ordinals shall not be taken to necessarily imply order (for example, time order, space order).

Electrically Connected: means either directly electrically connected, or indirectly electrically connected, such that intervening elements are present; in an indirect electrical connection, the intervening elements may include inductors and/or transformers.

Mechanically connected: Includes both direct mechanical connections, and indirect mechanical connections made through intermediate components; includes rigid mechanical connections as well as mechanical connection that allows for relative motion between the mechanically connected components; includes, but is not limited, to welded connections, solder connections, connections by fasteners (for example, nails, bolts, screws, nuts, hook-and-loop fasteners, knots, rivets, quick-release connections, latches and/or magnetic connections), force fit connections, friction fit connections, connections secured by engagement caused by gravitational forces, pivoting or rotatable connections, and/or slidable mechanical connections.

field-enclose: sufficient degree and type of enclosure so that electric fields are at least substantially blocked by the field enclosing member.

coupled lines: any type of coupled electrical lines, including, but not limited to strip lines.

coupled strip lines: a coupled line in the form of a pair of broad, flat conductors, each having two major surfaces, where one major surface on each strip line faces, and is in close proximity to, a corresponding major surface on the other strip line; strip lines will often have solid dielectric material between them (such as printed circuit board material), but this is not necessarily required.

dielectric material: solid dielectric material, such as printed circuit board material.

surface: not necessarily planar or continuous; for example, a mesh box would be considered to have an exterior surface despite the corners of the box and the mesh structure.

port: any sort of terminal; not limited to terminals suitable for detachably attaching standard electrical connectors (for example, SMA connectors) to; for example, a pad on a PCB may be considered as a "port."

Unless otherwise explicitly provided in the claim language, steps in method or process claims need only be performed that they happen to be set forth in the claim only to the extent that impossibility or extreme feasibility problems dictate that the recited step order be used. This broad interpretation with respect to step order is to be used regardless of alternative time ordering (that is, time ordering of the claimed steps that is different than the order of recitation in the claim) is particularly mentioned or discussed in this document. Any step order discussed in the above specification, and/or based upon order of step recitation in a claim, shall be considered as required by a method claim only if: (i) the step order is explicitly set forth in the words of the method claim itself; and/or (ii) it would be substantially impossible to perform the method in a different order. Unless otherwise specified in the method claims themselves, steps may be performed simultaneously or in any sort of temporally overlapping manner. Also, when any sort of time ordering is explicitly set forth in a method claim, the time ordering claim language shall not be taken as an implicit limitation on whether claimed steps are immediately consecutive in time, or as an implicit limitation against intervening steps.

What is claimed is:

1. A balun circuit comprising:
a first pair of coupled lines;
a first balanced port;
a first unbalanced port;
a first re-entrant box; and
a first ferrite member;
wherein:
the first ferrite member is made of material which is ferrimagnetic and non-electrically-conductive;
the first pair of coupled strip lines is electrically connected to the first balanced port and the first unbalanced port;
the first re-entrant box includes an exterior surface and is made from electrically conductive material;
the first re-entrant box field-encloses the first pair of coupled strip lines;
the first re-entrant box is not electrically connected to the first pair of coupled lines;
the first ferrite member includes an interior surface and defines an interior space; and
the first pair of coupled strip lines and the first re-entrant box are located at least substantially within the interior space of the first ferrite member.

2. A balun circuit comprising:
a first pair of coupled lines;
a first balanced port;
a first unbalanced port;
a first electrically conductive member; and
a first magnetic-material member;
wherein:
the first pair of coupled lines is electrically connected to the first balanced port and the first unbalanced port;

the first electrically conductive member includes an exterior surface;

the first electrically conductive member field-encloses the first pair of coupled lines;

the first electrically conductive member is not electrically connected to the first pair of coupled lines;

the first magnetic-material member includes an interior surface and defines an interior space; and the first pair of coupled lines and the first electrically conductive member are located at least substantially within the interior space of the first magnetic material member.

3. The circuit of claim 2 wherein the first magnetic-material member is made of ferrimagnetic material.

4. The circuit of claim 2 wherein the first magnetic-material is made of material which is non-electrically-conductive.

5. The circuit of claim 2 wherein the first pair of coupled lines is in the form of a first pair of coupled strip lines.

6. The circuit of claim 5 further comprising a first dielectric material member, wherein:

the first dielectric material member is at least substantially located in the interior space of the first magnetic-material member; and the first dielectric member is at least partially located in a space between the first pair of coupled strip lines.

7. The circuit of claim 6 wherein:

the first dielectric member is made of printed circuit board material; and the first pair of coupled strip lines are in the form of lines printed on the first dielectric member.

8. The circuit of claim 2 wherein the first pair of coupled lines, the first electrically conductive member and the first magnetic-material member are sized, shaped, structured, located and/or connected so that an operational frequency range of the balun are at least substantially within a high frequency radio frequency spectrum.

9. The circuit of claim 8 wherein the operational frequency range is within the following range 30 MHz to 1000 MHz.

10. The circuit of claim 2 wherein the first pair of coupled lines, the first electrically conductive member and the first magnetic-material member are sized, shaped, structured, located and/or connected so that an operational power rating of the balun is greater than 100 watts.

11. The circuit of claim 2 wherein the electrically conductive member is relatively thin relative to a thickness of the first magnetic-material member.

12. The circuit of claim 2 wherein at least substantially the entire exterior surface of the electrically conductive member is in contact with at least substantially the entire interior surface of the magnetic-material member.

13. A method of making a carrier-substrate-mounted balun, the method comprising:

forming, by printed circuit board construction techniques, an electrically conductive enclosure sub-assembly including:

a first plurality of printed circuit board members, a first pair of coupled strip lines, a first balanced port, a first unbalanced port, and a first electrically conductive member;

inserting at least a substantial portion of the first electrically conductive enclosure sub-assembly into a recess in a first magnetic-material member to form a magnetically-enclosed sub-assembly; and attaching the magnetically-enclosed sub-assembly to a first substrate to form a carrier-substrate-mounted balun;

wherein:

the first electrically conductive member has an exterior surface and defines an interior space;

the interior space of the first electrically conductive member is at least substantially filled by the first pair of coupled strip lines and the plurality of printed circuit board members; and at the forming step, the electrically conductive member is formed, at least in part, by coating peripheral edges of the plurality of printed circuit boards with electrically conductive material.

14. The method of claim 13 wherein:

at the forming step, the plurality of printed circuit board members are formed in a stack formation; and each coupled strip line of the first pair of coupled strip lines is located between printed circuit board members in the stack formation.

\* \* \* \* \*